(12) United States Patent
Benson et al.

(10) Patent No.: US 8,614,151 B2
(45) Date of Patent: Dec. 24, 2013

(54) METHOD OF ETCHING A HIGH ASPECT RATIO CONTACT

(75) Inventors: Russell A. Benson, Boise, ID (US); Ted Taylor, Boise, ID (US); Mark Kiehlbauch, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1116 days.

(21) Appl. No.: 11/969,443

(22) Filed: Jan. 4, 2008

(65) Prior Publication Data

US 2009/0176375 A1    Jul. 9, 2009

(51) Int. Cl.
*H01L 21/302*    (2006.01)
*B44C 1/22*    (2006.01)

(52) U.S. Cl.
USPC ............... 438/720; 438/710; 216/41; 216/67

(58) Field of Classification Search
USPC ................. 216/41, 67; 438/710, 720
See application file for complete search history.

(56) References Cited

U.S. PATENT DOCUMENTS

| | | | |
|---|---|---|---|
| 5,431,772 A | 7/1995 | Babie et al. | |
| 5,468,341 A | 11/1995 | Samukawa | |
| 5,503,901 A | 4/1996 | Sakai et al. | |
| 5,662,770 A | 9/1997 | Donohoe | |
| 6,123,862 A | 9/2000 | Donohoe et al. | |
| 6,177,147 B1 | 1/2001 | Samukawa et al. | |
| 6,348,158 B1 | 2/2002 | Samukawa | |
| 6,383,918 B1 | 5/2002 | Ku et al. | |
| 6,475,920 B2 | 11/2002 | Coburn et al. | |
| 6,506,674 B2 | 1/2003 | Ikeda et al. | |
| 6,544,895 B1 | 4/2003 | Donohoe | |
| 6,613,691 B1 | 9/2003 | Hung et al. | |
| 6,833,325 B2 | 12/2004 | Huang et al. | |
| 6,921,725 B2 | 7/2005 | Donohoe | |
| 6,962,879 B2 | 11/2005 | Zhu et al. | |
| 7,059,267 B2 | 6/2006 | Hedberg et al. | |
| 7,074,724 B2 | 7/2006 | Donohoe et al. | |
| 7,112,533 B2 | 9/2006 | Abatchev et al. | |
| 7,144,520 B2 | 12/2006 | Ichiki et al. | |
| 7,169,695 B2 * | 1/2007 | Huang et al. | 438/618 |
| 2001/0055843 A1 * | 12/2001 | Kim et al. | 438/201 |
| 2002/0142610 A1 | 10/2002 | Chien et al. | |
| 2003/0045114 A1 | 3/2003 | Ni et al. | |
| 2003/0162407 A1 * | 8/2003 | Maex et al. | 438/725 |
| 2004/0124177 A1 * | 7/2004 | Urban et al. | 216/67 |
| 2004/0248413 A1 | 12/2004 | Donohoe et al. | |

(Continued)

FOREIGN PATENT DOCUMENTS

| | | |
|---|---|---|
| EP | 0726596 A2 | 8/1996 |
| WO | 9616437 A1 | 5/1996 |
| WO | 2007105261 A1 | 9/2007 |

OTHER PUBLICATIONS

Ohtake et al., J. Vac. Sci. Technol. B 20(3), p. 1026-1030, May/Jun. 2002.

(Continued)

*Primary Examiner* — Shamim Ahmed
(74) *Attorney, Agent, or Firm* — TraskBritt

(57) ABSTRACT

Methods and an etch gas composition for etching a contact opening in a dielectric layer are provided. Embodiments of the method use a plasma generated from an etch gas composed of $C_4F_8$ and/or $C_4F_6$, an oxygen source, and a carrier gas in combination with tetrafluoroethane ($C_2F_4$) or a halofluorocarbon analogue of $C_2F_4$.

28 Claims, 2 Drawing Sheets

(56) References Cited

U.S. PATENT DOCUMENTS

| | | | |
|---|---|---|---|
| 2005/0045276 A1* | 3/2005 | Patel et al. | 156/345.43 |
| 2005/0056941 A1* | 3/2005 | Vanhaelemeersch et al. | 257/773 |
| 2005/0181588 A1 | 8/2005 | Kim | |
| 2005/0218373 A1 | 10/2005 | Ko | |
| 2006/0011579 A1 | 1/2006 | Ko | |
| 2006/0186087 A1 | 8/2006 | Donohoe et al. | |
| 2007/0026677 A1* | 2/2007 | Ji et al. | 438/689 |
| 2007/0049018 A1 | 3/2007 | Sandhu et al. | |
| 2007/0123031 A1 | 5/2007 | Isogai | |
| 2009/0045165 A1* | 2/2009 | Narishige et al. | 216/41 |

OTHER PUBLICATIONS

Samukawa et al., J. Vac. Sci. Technol. A 17(5), p. 2463-2466, Sep./Oct. 1999.

Samukawa et al., J. Vac. Sci. Technol. A 17(5), p. 2551-2556, Sep./Oct. 1999.

Ohtake, et al., J. Vac Sci. Technol. B 21(5), p. 2142-2146, Sep./Oct. 2003.

Watanabe, et al., Hitachi Review, vol. 52 (2003), No. 3, pp. 166-170.

Reyes-Betanzo, et al., Vac. Sci. Technol. A 17(6), 3179 (1999).

Shimmura et al., J. Vac. Sci. Technol. B 22(2), p. 533-538, Mar./Apr. 2004.

Sun, et al., Abstract submitted for the GEC06 Meeting of The American Physical Society, Jun. 16, 2006.

Shibayama, et al., Plasma Sources Sci. Technol. 5 (1996), p. 254-258.

Wonseok Lee, et al., Dielectric Etch, Applied Materials, PEUG Meeting, Mar. 10, 2005.

Gautham Nair, Ultrafast Structural Changes in Reacting Molecule, http://www.sciwrite.caltech.edu/journal03/nair.html, printed Sep. 3, 2008.

Zou, et al., Journal of Chemical Physics, vol. 113, No. 17, Nov. 1, 2000, pp. 7149-7157.

Samukawa, et al., J. Vac. Sci. Technol. B 18(1), Jan./Feb. 2000, pp. 166-171.

Ihee, et al., J. Phys. Chem. A 2002, 106, 4087-4103.

Barela et al., J. Vac. Sci. Technol. A23(3), May/Jun. 2005, pp. 408-416.

Khundkar, Lutfur Rahman, Microcanonical Rates of Unimolecular Reactions Studied by Time-Resolved Photofragment Spectroscopy, Dissertation, California Institute of Technology. 1988, abstract only.

\* cited by examiner

METHOD OF ETCHING A HIGH ASPECT RATIO CONTACT

TECHNICAL FIELD

Embodiments of the invention relate to gas chemistries and methods of plasma etching high aspect ratio contacts (HARCs) in oxide layers.

BACKGROUND OF THE INVENTION

In semiconductor devices, insulating layers such as silicon dioxide ($SiO_2$), doped oxide such as BPSG, and silicon nitride, are used to electrically separate conductive layers, such as doped polysilicon, metals, refractory metal silicides, etc. High aspect ratio contact (HARC) etching is a key process for forming contact hole interconnections through insulating layers to an active device area or conductive layer in high density integrated devices. HARCs require etching processes that produce a vertical profile and a defined critical dimension (CD). Another application for HARC features in dielectrics is the formation of capacitor or container structures in stacked capacitor DRAM.

In a typical plasma etching, a substrate is positioned on a chuck in a gas chamber, an etchant gas is introduced into the chamber, and the chamber pressure is reduced. An energy source/power supply creates a charged electric or electromagnetic field through electrodes positioned within the chamber to energize the etchant gas into a plasma state. The etchant gas is transformed into a disassociated mixture of uncharged neutrals as well as electrons and positive ions. Typically, the positive ions are accelerated to the substrate by a radio frequency (RF) biased electrode sheath providing directionality for forming vertical contact hole profiles, and the chuck supporting the substrate acts as a bottom electrode and can be biased by a second RF power source. The ions react with the substrate thereby removing the exposed material from the semiconductor device.

Generally, standard processes for etching through silicon dioxide ($SiO_2$) to underlying silicon and/or silicon nitride use fluorocarbon gas plasmas. The dissociation of the fluorocarbon molecules by the action of plasma generates active radicals and/or ions that act on the $SiO_2$ substrate. For example, in some high density plasmas, $CF^+$, $CF_2^+$ and $CF_3^+$ ions generated from $CF_3$ and other $C_xF_y$ radicals (where x is up to 11 and y is up to 15) are dominant etching ions for $SiO_2$, with $Ar^+$ ions sputtering $CF_x$ films on oxide, and less fluorinated radicals (e.g., $CF_2$ and CF) are adsorbed on the sidewalls and bottom surfaces in the contact hole of the $SiO_2$ during the etching process and polymerize to form a nonvolatile fluoropolymer layer that inhibits etching by the ions. Precise control of the balance between adsorbing radicals and etching ions during $SiO_2$ contact plasma etching is important to simultaneously passivate the sidewalls of the opening and extend the etch front at the bottom of the opening. However, such control is difficult when using conventional fluorocarbon chemistries.

Problems including bowing and/or twisting of the openings often occur during HARC etches. FIGS. 1 and 2 illustrates a substrate fragment (e.g., wafer) designated generally as 10, showing formation of a contact hole 12 in a dielectric layer 14 to an underlying substrate layer 16 by prior art etching methods. Bowing, illustrated in FIG. 1, is generally formed by the reaction of free fluorine which accumulates on the sidewalls 18 of the contact opening 12 during etching (arrows ↓↓↓) and laterally attacks and etches the exposed sidewalls producing a characteristic bowing 20. During typical HARC etches, charge buildup along the sidewalls 18 of a narrow and deep opening can deflect incoming ions causing changes in the trajectory of those ions. Twisting, illustrated in FIG. 2, can be caused by asymmetric polymer deposition 22 along the sidewalls 18 during etching in conjunction with feature charging, which can cause a deflection of incoming etching ions and a changed trajectory (arrow) of the ions, resulting in the twisting or bending of the contact hole 12 from a perfectly vertical profile with the hole tending toward one side or the other. Twisting of the contact hole can lead to misalignment and an imperfect contact between a subsequently deposited conductive metal and an active area landing region 24, for example, in the underlying substrate 16. Deviations such as bowing and twisting can also result in a non-vertical contact hole and shorting of the contact to an adjacent contact or other structure.

It would be useful to provide a method and etchant gas for etching high aspect ratio openings in silicon oxide layers that overcomes these or other problems.

BRIEF DESCRIPTION OF THE DRAWINGS

Embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

DETAILED DESCRIPTION OF THE INVENTION

The following description with reference to the drawings provides illustrative examples of devices and methods according to embodiments of the invention. Such description is for illustrative purposes only and not for purposes of limiting the same.

In the context of the current application, the term "semiconductor substrate" or "semiconductive substrate" or "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive substrates, wafer fragments or wafers described above.

As used herein, the term "high-aspect ratio" refers to depth-to-width (or diameter) ratio of about 15:1 or more.

Embodiments of the invention relate to methods of plasma etching doped and undoped dielectric materials used in semiconductive microelectronic device processing to producing openings to fabricate high aspect ratio contacts or containers (HARCs). The invention provides processing parameters for the etching of a high aspect ratio contact hole that reduce bowing and twisting of the contact opening during etching, maintain a critical dimension (CD) for the entire depth profile of the contact hole, and produce a contact hole with a vertical profile that is substantially cylindrical with minimal taper. For example, a contact with a depth of about 2 µm, a top CD of 60 nm, and a bottom CD of about 45-60 nm would be considered as having the required CD profile control.

Figure 3:
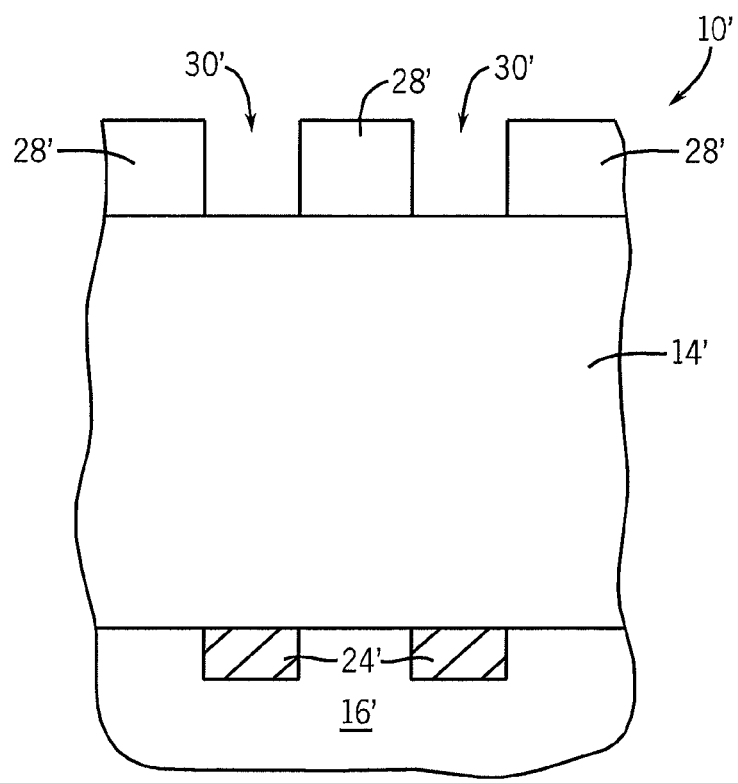
FIG. 3 illustrates an elevational, cross-sectional view of a portion of a substrate at a preliminary processing stage according to an embodiment of the present disclosure.

An embodiment of a method according to the invention is illustrated with reference to FIGS. 3 and 4. FIG. 3 illustrates a substrate fragment indicated generally with reference to numeral 10' at a preliminary processing stage. The substrate fragment 10' comprises an insulating or dielectric layer 14' formed on a substrate layer 16', and an active area or element 24' (e.g., a diffusion area, contact, conductive line, etc.). The substrate fragment 10' in progress can comprise a semiconductor wafer substrate or the wafer along with various process layers formed thereon, including one or more semiconductor layers or other formations, and active or operable portions of semiconductor devices.

The dielectric layer 14' is formed to a selected thickness to be etched to define high aspect ratio contact hole, for example, a thickness of about 2-3 µm. The dielectric layer 14' can be formed of undoped silicon dioxide ($SiO_2$) or doped $SiO_2$, for example, silicon oxide deposited from tetraethylorthosilicate (TEOS), borophosphosilicate glass (BPSG), borosilicate glass (BSG), and phosphosilicate glass (PSG), or other materials such as nitrides (e.g., silicon nitrides ($Si_xN_y$) such as $Si_3N_4$) or silicon oxynitrides ($SiO_xN_y$), in a single layer or multiple layers. The underlying substrate layer 16' compositionally dissimilar to the dielectric layer 14', and can be composed of a nitride etch stop layer (e.g., $Si_3N_4$), a refractory metal nitride such as titanium nitride, tungsten nitride, etc.), a silicon dioxide layer with different doping than a silicon dioxide dielectric layer 14', a silicon layer such as monocrystalline silicon or polysilicon, a doped silicon region, a metal silicide such as titanium silicide, a metal interconnect, or other material layer. In the illustrated example, substrate layer 16' is $SiO_2$ with a contact area 24' (e.g., polysilicon).

An etch-resistant mask layer 28', for example, photoresist or hard mask material, is formed over the dielectric layer 14' and, as depicted, is patterned and etched to define openings 30' that expose portions of the dielectric layer.

Figure 4:
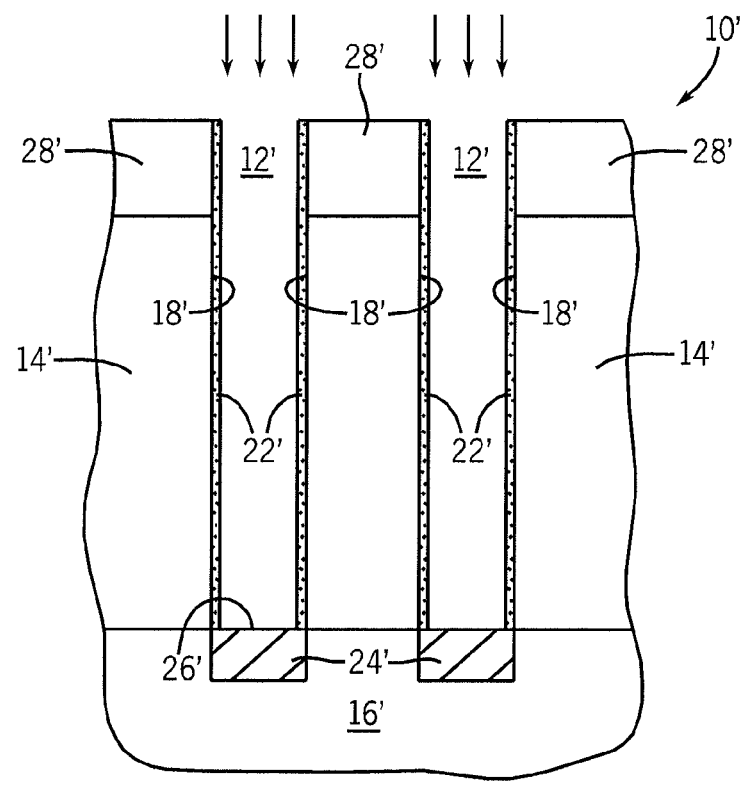
FIG. 4 is a cross-sectional view of the substrate depicted in FIG. 3 at a subsequent processing stage.

Referring to FIG. 4, the dielectric layer 14' is etched to form a high aspect ratio contact opening 12' (i.e., contact hole and via, or other opening such as a trench) extending to the underlying substrate layer 16' for forming, for example, a contact hole for an interconnect level, a gate electrode, a capacitor electrode, a via, etc., in the fabrication of various devices or circuits, such as SRAMs, DRAMs, etc. Typically, the contact opening 12' is etched to a high aspect ratio of about 1:15 to about 1:40, or about 1:20 to about 1:30, with a critical dimension (CD) (width) of less than about 100 nm or about 25-70 nm, and depth (d) of about 1-3 µm, for example.

In embodiments of the invention, the dielectric layer 14' is etched to form a contact hole 12' using a HARC gas plasma (arrows ↓↓↓) generated according to the invention utilizing $C_4F_8$ (octafluorocyclobutane), $C_4F_6$ (hexafluorobutadiene) or a mixture thereof, an oxygen source, and an inert gas in combination with $C_2F_4$ (tetrafluoroethane). The $C_4F_8$, $C_4F_6$ and $C_2F_4$ gases generate $CF_2$ radicals as a gas precursor for polymer deposition and $CF_3^+$ ions to etch the silicon oxide layer. In some embodiments, the etchant gas consists essentially of or consists of $C_4F_8$ and/or $C_4F_6$, an oxygen source(s), inert gas(es), and $C_2F_4$.

The oxygen source can be, for example, oxygen ($O_2$), carbon monoxide (CO), or mixtures thereof, in amounts that do not diminish the performance of the etchant gases. The oxygen source will react with the carbon and fluorine-containing ions ($CF_x$) within the plasma to adjust the amount of carbon and fluorine that attaches to the sidewalls 18', and to suppress "etch stop" that can result from carbon deposits on the bottom surface 26' of the contact openings 12' hole.

Optionally, the etchant gas includes an inert carrier gas, which is known in the art, such as argon (Ar), xenon (Xe), neon (Ne), krypton (Kr) and helium (He). Carrier gases are present in the etchant to dilute the etchant gases so that excessive etching or deposition does not occur, to stabilize the plasma being generated, and to enhance the uniformity of the etching process. In some embodiments, xenon (Xe), neon (Ne), and/or krypton (Kr) are used as a carrier gas in lieu of or in combination with argon (Ar).

In embodiments of the invention, the fluorocarbon feed gas is composed $C_4F_8/O_2/Ar/C_2F_4$, $C_4F_6/O_2/Ar/C_2F_4$ or $C_4F_8/C_4F_6/O_2/Ar/C_2F_4$. In other embodiments, $O_2$ is combined with or replaced by CO, and/or Ar is replaced by or combined with Xe, Ne, Kr and/or He. In various embodiments, the feed gas can comprise, consist essentially of or consist of the foregoing gases.

The etch gas can optionally include one or more additional fluorocarbon gases having the general formula $C_xF_y$ where x=1-6 and y=2-8, for example, $CF_4$ (carbon tetrafluoride), $C_2F_6$ (hexafluoroethane), $C_3F_6$ (hexafluoropropylene), $C_3F_8$ (octafluoropropane), $C_5F_8$ (octafluorocyclopentene) and $C_6F_6$ (perfluorobenzene) among others, and combinations thereof.

It was found that adding $C_2F_4$ during a HARC etch utilizing an etch chemistry of $C_4F_8$ or $C_4F_6$ with an oxygen source and inert gas, provides the deposition of a thin and conformal polymer layer 22' to passivate the sidewalls 18' of the contact opening 12' during etching to protect against lateral etching and minimize twisting and bowing of the contact hole, particularly during an overetch to remove remaining residual oxide over the substrate layer 16', without having to compensate for the added polymerizing gas (i.e., $C_2F_4$). In some embodiments, the conformal polymer layer on the sidewalls of the opening has a thckness of about 5-20 Å for the depth profile of the opening.

The $CF_x$-based polymer deposition that results from the addition of $C_2F_4$ to a $C_4F_8$ and/or $C_4F_6$ etch gas provides an improved passivation layer that is conformal and symmetrical, and deposits over the sidewalls as the contact hole is etched. The conformal polymer layer prevents ion-driven lateral etching or "bow" in localized areas of the sidewall to maintain critical dimension (CD) throughout the depth profile of the contact hole and reduce container deformation. The deposition of the conformal polymer layer on the sidewalls of the contact hole can also serve as a weak conduction path to dissipate charge at the bottom of the contact hole and reduce twisting. Also, symmetric polymer deposition reduces the probability of forming a lateral electric field, which reduces twisting. Irregularities in intrafeature plasma-deposited polymer materials are known to transfer into the substrate to be etched. The very regular and conformal layer of polymer material that is generated by the present $C_4F_8/C_4F_6/C_2F_4$-based HARC chemistry reduces deformations and defects in the contact hole, while the simultaneous ion bombardment suppresses absorption or deposit of polymer on the etch front at the bottom of the contact hole, thus facilitating etching without impacting taper.

Figure 1:
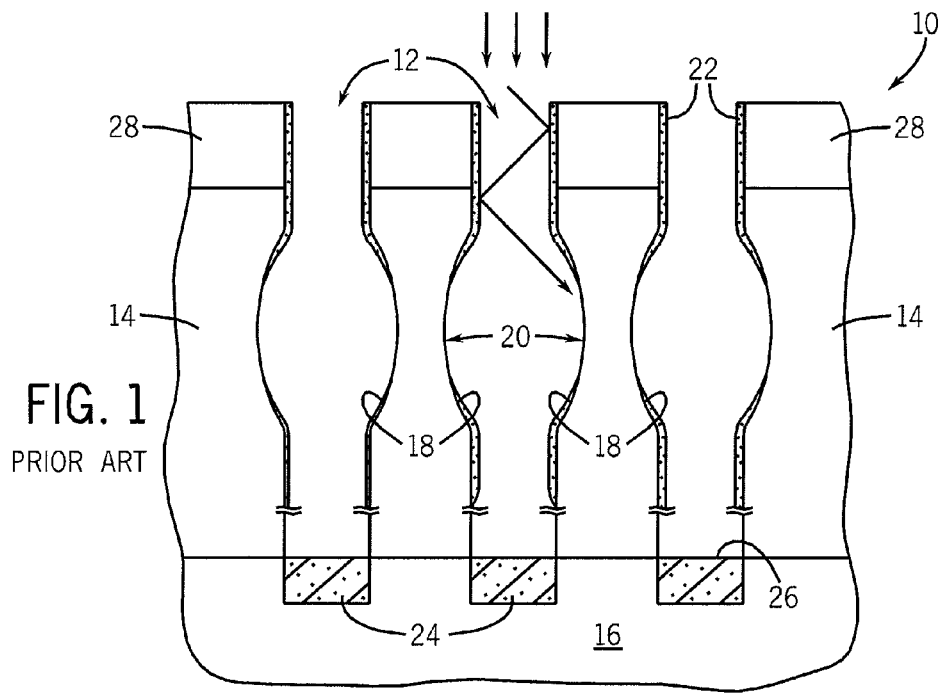
FIG. 1 illustrates a prior art processing that results in bowing of a contact hole during etching.
Figure 2:
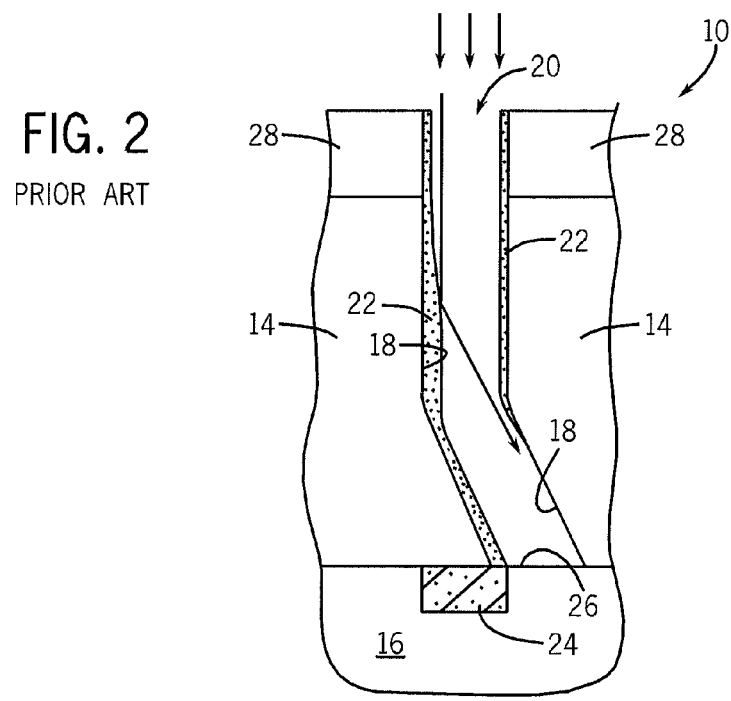
FIG. 2 illustrates a prior art processing that results in twisting of a contact hole during etching.

Investigators have described patterning $SiO_2$ using a gas mixture of trifluoroiodomethane ($CF_3I$) and tetrafluoroethane ($C_2F_4$). However, $CF_3I$ is not a preferred etch chemistry because it is a highly corrosive gas and does not perform as well in achieving the desired contact hole profile. The present etch chemistries overcome those drawbacks and achieve a dynamic equilibrium such that polymer is deposited and removed at about the same rate, which prevents etch stop and provides continual passivation whereby the sidewalls are not exposed, this preventing a bow effect. The etching gases can also be controlled to avoid deposition of excess polymer residue that can cause twisting of the contact hole (e.g., as in FIG. 2) and to limit the accumulation of plasma-deposited polymer residues on the bottom surface 26' of the contact opening 12'.

In embodiments of the invention, the etch gas plasma can be a mixture of gases for high aspect ratio etching of silicon oxide at a significantly higher rate than a nitride and/or silicon substrate layer 16', that is, the etch gas plasma is highly selective to nitrides and silicon. Such an etch gas plasma allows the etching of an oxide layer 14' down to a substrate layer 16' without substantially damaging nitride or silicon layers.

In other embodiments, the etch gas can include a hydrocarbon such as $CH_4$ (methane) and/or one or more hydrofluorocarbon feed gases having the general formula $C_xH_yF_z$ where x=1-6, y=1-6, and z=1-6, such as $CHF_3$ (trifluoromethane), $CH_2F_2$ (difluoromethane), $CH_2F_4$ (tetrafluoroethane), $CH_3F$ (methyl fluoride), $C_2HF_5$ (pentafluoroethane), $C_2H_2F_4$ (tetrafluoroethane), $C_2H_5F$ (ethyl fluoride) $C_3HF_5$ (pentafluoropropene), $C_3HF_7$ (heptafluoropropane), $C_3H_2F_6$ (hexafluoropropane), $C_3H_3F_3$ (trifluoropropene), $C_3H_3F_5$ (pentafluoropropane), $C_3H_4F_4$ (tetrafluoropropane), $C_4HF_7$ (heptafluorobutene), $C_4HF_9$ (nonafluorobutane), $C_4H_2F_6$, (hexafluorobutene), $C_4H_2F_8$ (octafluorobutane), $C_5HF_9$ (nonafluoropentene), $C_5HF_{11}$ (undecafluoropentane), or any hydrofluorobenzene (e.g, $C_6H_3F_3$), among others. Embodiments of an etch gas incorporating a hydrofluorocarbon gas include, for example, $C_4F_8/CHF_3/O_2/Ar$, among others. The inclusion of a hydrocarbon (e.g., $CH_4$) and/or a hydrofluorocarbon feed gas is useful in etching dielectrics other than $SiO_2$, including, for example, silicon nitride (e.g., $Si_xN_y$, such as $Si_3N_4$).

The benefit of using $C_2F_4$ is that the deposited polymer is a CF-based polymer that is easily stripped/cleaned compared to Si-containing polymers formed by processes using an etch gas such as $SiH_4$, $SiF_4$ or $SiCl_4$. The CF-based polymer generated from $C_2F_4$ is very conformal, which allows the $C_2F_4$ gas to be added without having to alter the amount of $O_2$ in the $C_4F_8/C_4F_6$ etch gas to compensate for the added polymerizing gas ($C_2F_4$). In addition, the use of $C_2F_4$ does not result in over-deposit that can "choke off" the contact opening (i.e. breadloafing).

Although embodiments of the etch plasma gas formed with $C_2F_4$ gas provides the desired conformal polymer deposition during etching, $C_2F_4$ gas is highly flammable and unstable when purified and can spontaneously polymerize in gas lines and during storage if exposed to trace amounts of $O_2$. $C_2F_4$ can be stabilized but the stabilizing agents such as d-limonene ($C_{10}H_{16}$), carbon dioxide ($CO_2$) or hydrochloric acid (HCl), can adversely effect the etch process. In addition, the expense of using $C_2F_4$ can be prohibitive.

In other embodiments of the invention, a contact opening is etched in a dielectric layer using an etch gas that is composed of $C_4F_8$ and/or $C_4F_6$, an oxygen source (e.g., $O_2$ and/or CO), inert gas(es), and a halofluorocarbon that will generate $C_2F_4$ to provide the same or similar polymer deposition during a dry etch of oxide as pure $C_2F_4$ fed into the $C_4F_6$—$C_4F_8$ etch plasma.

The halofluorocarbon utilized in the etch gas is at least one of 1,2-dibromo tetrafluoroethane ($BrCF_2CF_2Br$, or $C_2F_4Br_2$), 1,2-diiodo tetrafluoroethane ($ICF_2CF_2I$, or $C_2F_4I_2$) and diiodo difluoromethane ($CF_2I_2$). The foregoing halofluorocarbons are stable liquid sources that will dissociate into $CF_2$ radicals in a plasma. $C_2F_4Br_2$ and $C_2F_4I_2$ will dissociate under exposure to UV light (e.g., 266-193 nm) to form $C_2F_4$ which, in a plasma, forms two units of $CF_2$ radicals.

The use of $C_2F_4$ or the foregoing halofluorocarbons in a $C_4F_6$ and/or $C_4F_8$ etch gas plasma enabling more precise control of the $CF_2$ radical generation in the plasma gas, resulting in the formation of a regular and conformal polymer layer on the sidewalls of the contact opening during etching to minimize bowing and twisting and improve profile control of the contact hole. The foregoing halofluorocarbons function as analogues of $C_2F_4$ and provide a process impact and polymer deposition during a dry etch similar to pure $C_2F_4$ that is fed into a $C_4F_6$ and/or $C_4F_8$ etch plasma, but with greater stability and without the problems posed by pure $C_2F_4$ which is flammable and can explosively polymerize upon exposure to oxygen.

The plasma may be generated utilizing any known suitable etching device, such as an etcher available, for example, the APPLIED CENTURA ENABLER® Etch system from Applied Materials, Inc., the 2300 Exelan system from Lam Research Corporation, a TEL Unity SCCM Dielectric Etch Chamber from Tokyo Electron Limited, or any other high density plasma etcher. Examples of equipment and techniques for plasma etching are described in U.S. Pat. No. 6,123,862 to Donohoe et al., which is commonly assigned. It should be readily apparent to one skilled in the art that depending upon the particular etching apparatus utilized to generate the plasma various etch parameters such as the gas mixture, temperature, RF power, pressure, and gas flow rate, among others, can be varied to achieve the desired etch rate and etch characteristics of the plasma system.

A substrate 10' (e.g., wafer) having a dielectric layer 14' to be etched is placed into a plasma reaction chamber of an appropriate apparatus for conducting the etching process, and the etchant gases are generally flowed into a plasma reaction chamber, and power is applied to induce a plasma from the etchant gases. In general, a plasma is formed over the surface of the wafer and a bias power is supplied to the substrate containing the wafer or to a support or chuck supporting the substrate, to accelerate ions from the reactant gases toward the surface. Species formed from the etchant gases (e.g., fluorine ions) impinge upon and react with the areas of the dielectric layer 14' exposed through the patterned etch-resistant mask layer 28' to etch away and advance the etch front. By-products, which may be volatile, can be exhausted from the reaction chamber through an exit port.

The etch process is conducted under conditions that simultaneously balance the etch process, i.e., plasma generating reactive neutral and ionic species, which etch dielectrics if the ions ($CF_3^+$) possess sufficient energy supplied by the bias power at the wafer and deposit polymer material (via $CF_2$ radicals) on the sidewalls 18' of the contact opening or hole 12'. The bottom surface 26' is bombarded by ions during an overetch in order to remove any remaining residual oxide over the substrate layer 16'.

The gas flows of $C_4F_8$, $C_4F_6$ and $C_2F_4$ are controlled to optimize the $CF_2$ radical and $CF_3^+$ ion densities. In embodiments of the invention of a $C_4F_8/C_2F_4$ or $C_4F_6/C_2F_4$ etch gas, the gas flow rates into the plasma chamber are about 10-100 sccm for $C_4F_8$ or $C_4F_6$ (or about 50-70 sccm), about 50-150 sccm for $C_2F_4$ (or about 80-100 sccm), about 10-60 sccm for $O_2$ (or about 20-40 sccm), and about 500-1500 sccm for inert gas(es) (or about 900-1300 sccm). Generally, the ratio of $C_4F_8:C_2F_4$ is about 0.25-1.5:1 (or about 0.5-1:1), and the ratio of $C_4F_6:C_2F_4$ is about 0.25-1.5:1 (or about 0.5-1:1).

In embodiments of a $C_4F_8/C_4F_6/C_2F_4$ etch gas, the gas flow rates are typically about 0-100 sccm for $C_4F_8$ (or about 20-70 sccm), about 0-100 sccm for $C_4F_6$ (or about 20-70 sccm), about 50-150 sccm for $C_2F_4$ (or about 80-100 sccm), about 10-60 sccm for $O_2$ (or about 20-40 sccm), and about 500-1500 sccm for inert gas(es) (or about 900-1300 sccm), the combined total flow rate for $C_4F_6$ and $C_4F_8$ being a range of about 30-100 sccm (or about 50-70 sccm). Generally, the ratio of $C_4F_8$ and $C_4F_6$ (combined):$C_2F_4$ is about 0.25-1.5:1 (or about 0.5-1:1).

In embodiments of the invention utilizing a halofluorocarbon to replace $C_2F_4$, the etch gas flow rates into the plasma chamber are about 10-100 sccm for $C_4F_8$ or $C_4F_6$ (or about 50-70 sccm), about 50-150 sccm for $C_2F_4Br_2$ or $C_2F_4I_2$ (or about 80-100 sccm), about 100-300 sccm for $CF_2I_2$ (or about 160-180 sccm), about 10-60 sccm for $O_2$ (or about 20-40 sccm), and about 500-1500 sccm for inert gas(es) (or about 900-1300 sccm). The ratio of $C_4F_8$ or $C_4F_6$:$C_2F_4Br_2$ or $C_2F_4I_2$ is about 0.25-1.5:1 (or about 0.5-1:1), and the ratio of $C_4F_8$ or $C_4F_6$:$CF_2I_2$ is about 0.25-1.5:1 (or about 0.5-1:1).

In other embodiments, the etch gas flow rates into the plasma chamber are about 0-100 sccm for $C_4F_8$ (or about 20-70 sccm) and about 0-100 sccm for $C_4F_6$ (or about 20-70 sccm) with the combined total flow for $C_4F_6$ and $C_4F_8$ at about 30-100 sccm (or about 50-70 sccm), about 50-150 sccm for $C_2F_4Br_2$ or $C_2F_4I_2$ (or about 80-100 sccm), about 50-150 sccm for $CF_2I_2$ (or about 80-100 sccm), about 10-60 sccm for $O_2$ (or about 20-40 sccm), and about 500-1500 sccm for inert gas(es) (or about 900-1300 sccm). The ratio of $C_4F_8$ and $C_4F_6$:$C_2F_4Br_2$ or $C_2F_4I_2$ is about 0.25-1.5:1 (or about 0.5-1:1), and the ratio of $C_4F_8$ and $C_4F_6$:$CF_2I_2$ is about 0.25-1.5:1 (or about 0.5-1.0).

The etch gas can optionally include additional fluorocarbon gas(es) (e.g., $CF_4$, $C_2F_6$, etc.) with gas flow rates up to about 50 sccm (or about 10-50 sccm).

Optionally, the etch gas can also include about a hydrocarbon such as $CH_4$. Typical flow rates for $CH_4$ are up to about 5 sccm (or up to about 20 sccm), and for hydrofluorocarbons up to about 5 sccm (or up to about 20 sccm).

The flow rates of the various constituent gases of the etch gases can be adjusted as needed to provide suitable etching according to the methods of the invention, and to accommodate the size of the etching chamber and the wafer being etched. The power level of the plasma associated with the etch chamber and the pressure in the etch chamber should be sufficient to maintain the etching process. The source power level typically ranges from about 1000-3000 watts, the bias power level ranges from about 2000-7000 watts and the pressure generally ranges from about 10-30 mTorr.

The present invention forms contact holes having a high aspect ratio without causing bowing or twisting of the hole, with the hole having a diameter (CD) that is substantially the same throughout the depth of the hole.

After the etch of the contact hole 12' is completed, the mask layer 28' and polymer layer 22' can then be removed (stripped), for example, by dry etching with an oxygen plasma ashing step, or by a wet etch with a Piranha clean ($H_2SO_4/H_2O_2$).

The substrate 10' can undergo post-etch processing steps that are known in the art to fabricate desired components. For example, the resulting contact holes 12' can be further processed, for example, by filling with a metal or conductive material such as copper, aluminum, silicon, $Ti_3N_4$, among others, to form contacts or conductive lines, for example, to an underlying active area, contact, or conductive line, or with a metal-insulator-metal-stack to form capacitors with a dielectric material such as $Al_2O_3$, $HfO_2$, $ZrO_2$, $SrTiO_3$, and the like, in the fabrication of integrated circuit devices such as memory devices. Finished semiconductor wafers can be cut into dies, which may then be further processed into integrated circuit chips and incorporated in electronic devices.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations that operate according to the principles of the invention as described. Therefore, it is intended that this invention be limited only by the claims and the equivalents thereof. The disclosures of patents, references and publications cited in the application are incorporated by reference herein.

What is claimed is:

1. A method of etching an opening in a dielectric layer, comprising:
    forming a plasma etching gas from $C_4F_6$, $C_4F_8$ or a mixture of $C_4F_6$ and $C_4F_8$, an oxygen source gas, an inert gas, and $C_2F_4$; and
    etching the opening through the dielectric layer to an underlying substrate with the plasma etching gas while depositing polymer material to form and maintain a conformal polymer layer at a thickness effective to continually passivate sidewalls of the opening during the etching;
    wherein after the etching, the conformal polymer layer remains over the sidewalls.

2. The method of claim 1, wherein the plasma etching gas comprises $C_4F_6$:$C_2F_4$, $C_4F_8$:$C_2F_4$, or $C_4F_8$ and $C_4F_6$:$C_2F_4$ at a ratio of about 0.25-1.5:1.

3. The method of claim 1, wherein the dielectric layer comprises an oxide.

4. The method of claim 1, wherein the dielectric layer comprises silicon nitride and the plasma etching gas further comprises a hydrofluorocarbon having the general formula $C_xH_yF_z$ where x=1-6, y=1-6 and z=1-6, or a combination thereof.

5. The method of claim 1, wherein the opening is a contact hole or a trench having an aspect ratio of about 20-30:1.

6. The method of claim 1, wherein the conformal polymer layer on the sidewalls of the opening has a thickness of about 5-20 Å for the depth profile of the opening.

7. The method of claim 1, wherein the dielectric is etched at rate of about 3000-6000 Å/minute.

8. The method of claim 1, wherein the plasma etching gas consists essentially of the gases.

9. The method of claim 1, wherein forming the plasma etching gas comprises flowing the gases at a flow rate of about 10-100 sccm for $C_4F_6$ or $C_4F_8$ and at about 50-150 sccm for $C_2F_4$.

10. The method of claim 1, wherein forming the plasma etch gas comprises flowing $C_4F_6$ and $C_4F_8$ at a combined flow rate of about 30-100 sccm, and $C_2F_4$ at a flow rate of about 50-150 sccm.

11. A method of etching an opening in a dielectric layer, comprising:
    forming plasma etching gas from $C_4F_6$, $C_4F_8$ or a mixture thereof at a flow rate of about 50-70 sccm, an oxygen source gas at a flow rate of about 20-40 sccm, an inert diluent gas at a flow rate of about 900-1300 sccm, and $C_2F_4$ at a flow rate of about 80-100 sccm; and
    etching the opening through the dielectric layer to an underlying substrate with the plasma etching gas while depositing polymer material during the etching to form and maintain a conformal polymer layer at a thickness effective to continually passivate sidewalls of the opening during the etching;
wherein after the etching, the conformal polymer layer remains over the sidewalls.

12. A method of etching an opening in a dielectric layer comprising:
applying a plasma etching gas to etch the dielectric layer to an underlying substrate, the plasma etching gas formed from $C_4F_6$, $C_4F_8$ or mixture thereof, an oxygen source gas, an inert diluent gas, and a halofluorocarbon selected from the group consisting of $C_2F_4Br_2$, $C_2F_4I_2$ and $CF_2I_2$;
wherein a polymer material is deposited during the etching to form and maintain a conformal polymer layer at a thickness effective to continually passivate sidewalls of the opening during etching, and after the etching, the conformal polymer layer remains over the sidewalls.

13. The method of claim 12, wherein the plasma etching gas is formed by flowing in $C_4F_6$, $C_4F_8$ or a mixture thereof at a flow rate of about 10-100 sccm and the halofluorocarbon at a rate of about 50-300 sccm.

14. The method of claim 13, wherein the plasma etching gas is formed by flowing in $C_2F_4Br_2$ or $C_2F_4I_2$ at a rate of about 50-150 sccm, or $CF_2I_2$ at a rate of about 100-300 sccm.

15. The method claim 12, wherein the plasma etching gas comprises $C_4F_6$:halofluorocarbon, $C_4F_8$:halofluorocarbon or $C_4F_8$ and $C_4F_6$:halocarbon at a ratio of about 0.25-1.5:1.

16. The method of claim 12, wherein the plasma etching gas further comprises an additional fluorocarbon gas having the general formula $C_xF_y$ where x=1-6 and y=2-8.

17. The method of claim 12, wherein the dielectric layer comprises silicon nitride, and the plasma etching gas further comprises a hydrofluorocarbon gas having the general formula $C_xH_yF_z$ where x=1-6, y=1-6, and z=1-6, or a mixture thereof.

18. The method Claim of 12, wherein the plasma etching gas further comprises a hydrofluorocarbon gas having the general formula $C_xH_yF_z$ where x=1-6, y=1-6 and z=1-6.

19. A method of etching an opening in a dielectric layer, comprising:
applying a plasma etching gas comprising at least one of $C_4F_6$ and $C_4F_8$, an oxygen source gas, an inert diluent gas, and $C_2F_4$, in amounts effective to form a plasma etching gas to etch the opening through the dielectric layer while depositing a polymer material to form and maintain a conformal polymer layer on sidewalls of the opening at a thickness effective to continually passivate the sidewalls during the etching, wherein after the etching, the conformal polymer layer remains over the sidewalls.

20. The method of claim 19, wherein the etching gas further comprises an additional fluorocarbon gas having the general formula $C_xF_y$, where x=1-6 and y=2-8.

21. The method of claim 19, wherein the etching gas further comprises a hydrofluorocarbon gas having the general formula $C_xH_yF_z$ where x=1-6, y=1-6 and z=1-6, or a mixture thereof.

22. The method of claim 19, wherein the etching gas consists essentially of the gases.

23. A method of etching an opening in a dielectric layer, comprising:
applying a plasma etching gas consisting essentially of at least one of $C_4F_6$ and $C_4F_8$, an oxygen source gas, an inert diluent gas, and a halofluorocarbon selected from the group consisting of $C_2F_4Br_2$, $C_2F_4I_2$ and $CF_2I_2$, in amounts effective to etch the opening through the dielectric layer while depositing a polymer material to form and maintain a conformal polymer layer on sidewalls of the opening at a thickness effective to continually passivate the sidewalls during the etching, wherein after the etching, the conformal polymer layer remains over the sidewalls.

24. A method of etching an opening in a dielectric layer, comprising:
applying a plasma etching gas consisting essentially of at least one of $C_4F_6$ and $C_4F_8$, an oxygen source gas, an inert diluent gas, a halofluorocarbon selected from the group consisting of $C_2F_4Br_2$, $C_2F_4I_2$ and $CF_2I_2$, and at least one of an additional fluorocarbon gas having the general formula $C_x F_y$ where x=1-6 and y=2-8 and a hydrofluorocarbon gas having the general formula $C_xH_yF_z$ where x=1-6, y=1-6 and z=1-6,
said gases in amounts effective to etch the opening through the dielectric layer while depositing a polymer material to form and maintain a conformal polymer layer on sidewalls of the opening at a thickness effective to continually passivate the sidewalls during the etching, wherein the conformal polymer layer remains over the sidewalls after the etching.

25. The method of claim 1, further comprising, after the etching, removing the conformal polymer layer.

26. The method of claim 25, wherein the removing is conducted by a dry etch process.

27. The method of claim 26, wherein the dry etch process comprises an oxygen plasma ashing step.

28. The method of claim 25, wherein the removing is conducted by a wet etch process.

* * * * *

UNITED STATES PATENT AND TRADEMARK OFFICE
CERTIFICATE OF CORRECTION

PATENT NO. : 8,614,151 B2  
APPLICATION NO. : 11/969443  
DATED : December 24, 2013  
INVENTOR(S) : Russell A. Benson et al.

Page 1 of 1

It is certified that error appears in the above-identified patent and that said Letters Patent is hereby corrected as shown below:

In the Claims:

In column 8, line 55, in Claim 10, delete "etch" and insert -- etching --, therefor.

In column 8, line 60, in Claim 11, delete "forming" and insert -- forming a --, therefor.

In column 9, line 25, in Claim 15, after "method" insert -- of --.

In column 9, line 36, in Claim 18, delete "Claim of" and insert -- of claim --, therefor.

In column 10, line 31, in Claim 24, delete "$C_x\ F_y$" and insert -- $C_xF_y$ --, therefor.

In column 10, line 34, in Claim 24, delete "said" and insert -- the --, therefor.

Signed and Sealed this  
Fifteenth Day of April, 2014

Michelle K. Lee  
*Deputy Director of the United States Patent and Trademark Office*